US009653264B2

(12) United States Patent
Nagorny et al.

(10) Patent No.: US 9,653,264 B2
(45) Date of Patent: May 16, 2017

(54) INDUCTIVELY COUPLED PLASMA SOURCE FOR PLASMA PROCESSING

(75) Inventors: Vladimir Nagorny, Tracy, CA (US); Dongsoo Lee, Fremont, CA (US); Andreas Kadavanich, Fremont, CA (US)

(73) Assignee: Mattson Technology, Inc., Fremont, CA (US)

( * ) Notice: Subject to any disclaimer, the term of this patent is extended or adjusted under 35 U.S.C. 154(b) by 993 days.

(21) Appl. No.: 13/325,455

(22) Filed: Dec. 14, 2011

(65) Prior Publication Data

US 2012/0152901 A1 Jun. 21, 2012

Related U.S. Application Data

(60) Provisional application No. 61/424,452, filed on Dec. 17, 2010, provisional application No. 61/510,732, filed on Jul. 22, 2011.

(51) Int. Cl.
*H01J 37/32* (2006.01)

(52) U.S. Cl.
CPC ......... *H01J 37/321* (2013.01); *H01J 37/3211* (2013.01); *H01J 37/32669* (2013.01)

(58) Field of Classification Search
USPC ...... 118/723 I, 723 MP; 156/345.26, 345.28, 156/345.43, 345.48; 204/298.06; 216/37,
(Continued)

(56) References Cited

U.S. PATENT DOCUMENTS 5,571,366 A  11/1996  Ishii et al.
5,777,289 A   7/1998  Hanawa et al.
(Continued)

FOREIGN PATENT DOCUMENTS

KR    20030073342     9/2003
KR    20060135186    12/2006
(Continued)

OTHER PUBLICATIONS

Machine translation of KR 10-0772452 pulled Aug. 12, 2013.*
(Continued)

*Primary Examiner* — Duy Deo
*Assistant Examiner* — Erin Bergner
(74) *Attorney, Agent, or Firm* — Dority & Manning, P.A.

(57) ABSTRACT

Plasma processing apparatus and methods are disclosed. Embodiments of the present disclosure include a processing chamber having an interior space operable to receive a process gas, a substrate holder in the interior of the processing chamber operable to hold a substrate, and at least one dielectric window. A metal shield is disposed adjacent the dielectric window. The metal shield can have a peripheral portion and a central portion. The processing apparatus includes a primary inductive element disposed external to the processing chamber adjacent the peripheral portion of the metal shield. The processing apparatus can further include a secondary inductive element disposed between the central portion of the metal shield and the dielectric window. The primary and secondary inductive elements can perform different functions, can have different structural configurations, and can be operated at different frequencies.

5 Claims, 7 Drawing Sheets

(58) Field of Classification Search
USPC .......... 216/61, 67, 68; 219/121.43, 672;
250/251; 257/253; 315/111.21, 111.51;
343/895; 361/234; 427/575; 438/710,
438/714, 728
See application file for complete search history.

(56) References Cited

U.S. PATENT DOCUMENTS

| | | | |
|---|---|---|---|
| 5,795,429 | A | 8/1998 | Ishii et al. |
| 5,811,022 | A | 9/1998 | Savas et al. |
| 5,994,236 | A | 11/1999 | Ogle |
| 6,016,131 | A | 1/2000 | Sato et al. |
| 6,165,311 | A * | 12/2000 | Collins et al. .......... 156/345.26 |
| 6,238,588 | B1 | 5/2001 | Collins et al. |
| 6,248,250 | B1 | 6/2001 | Hanawa et al. |
| 6,267,074 | B1 | 7/2001 | Okumura |
| 6,270,617 | B1 | 8/2001 | Yin et al. |
| 6,474,258 | B2 | 11/2002 | Brcka |
| 6,475,335 | B1 | 11/2002 | Yin et al. |
| 6,551,447 | B1 | 4/2003 | Savas et al. |
| 7,232,767 | B2 | 6/2007 | George et al. |
| 2004/0045669 | A1* | 3/2004 | Okumura et al. ....... 156/345.35 |
| 2004/0060517 | A1 | 4/2004 | Vukovic et al. |
| 2006/0075967 | A1 | 4/2006 | Lu et al. |
| 2007/0181257 | A1 | 8/2007 | Comendant et al. |
| 2008/0050537 | A1 | 2/2008 | Godyak |
| 2011/0204023 | A1 | 8/2011 | Huh et al. |

FOREIGN PATENT DOCUMENTS

| | | | | |
|---|---|---|---|---|
| KR | 10-0772452 | * | 11/2007 | ......... H01L 21/3065 |
| KR | 100772452 | | 11/2007 | |
| KR | 20090076159 | | 7/2009 | |
| WO | WO 0017906 | | 3/2000 | |

OTHER PUBLICATIONS

Yamada et al., Model for a large area multi-frequency multiplanar coil inductively coupled plasma source, Journal of Vacuum Science & Technology A 14, 2859 (1996), pp. 2859-2870.*
Hopwood, Planar RF induction plasma coupling efficiency, Plasma Sources Sci. Techno!. 3 (1994) 460-464.*
Written Opinion and Search Report for PCT/US2011/064832 dated Jul. 9, 2012.

* cited by examiner

INDUCTIVELY COUPLED PLASMA SOURCE FOR PLASMA PROCESSING

PRIORITY CLAIM

The present application claims priority to U.S. Provisional Patent Application Ser. No. 61/424,452, filed Dec. 17, 2010, and to U.S. Provisional Patent Application Ser. No. 61/510,732 filed Jul. 22, 2011, which are incorporated herein by reference for all purposes.

FIELD

The present disclosure relates generally to plasma generation and, more particularly, to an apparatus and method for processing a substrate using a plasma source.

BACKGROUND

RF plasmas are used in the manufacture of devices such as integrated circuits, micromechanical devices, flat panel displays, and other devices. RF plasma sources used in modern plasma etch applications are required to provide a high plasma uniformity and a plurality of plasma controls, including independent plasma profile, plasma density, and ion energy controls. RF plasma sources typically must be able to sustain a stable plasma in a variety of process gases and under a variety of different conditions (e.g. gas flow, gas pressure, etc.). In addition, it is desirable that RF plasma sources produce a minimum impact on the environment by operating with reduced energy demands and reduced EM emission.

Various plasma sources are known for achieving these stringent plasma process requirements. Multi-frequency capacitively coupled plasma (CCP) sources have been used for independent control of ion energy and plasma density. CCP plasma sources, however, have some intrinsic problems and limitations. For instance: (a) gas pressure ranges are typically limited to low pressures; (b) high-density plasma generation requires very high frequency RF, causing problems with plasma uniformity, emissions, etc.; (c) there is interference between higher and lower frequency RF sheaths; (d) the wafer edge area is prone to severe nonuniformity; and (e) a CCP source has a narrow process window. Accordingly, CCP sources are not always suitable for certain plasma process operations.

Inductively coupled plasma (ICP) sources combined with RF bias have also been used, for example, to provide independent control of ion energy and plasma density. ICP sources can easily produce high-density plasma using standard 13.56 MHz and lower frequency RF power generators. Indeed, it is known to use multi-coil ICP sources to provide good plasma control and high plasma density. For instance, in one known ICP source, two coils are placed on top of a dielectric window separating plasma from the air. The two coils are powered with an RF generator and the power distribution function between the coils is assigned to a matcher. This arrangement can be very complex and expensive. In addition, the communication between coils above the dielectric window and in the plasma makes it difficult to provide true independent control of power distribution into the plasma. This design also limits the range of power distribution between coils such that the central coil still receives power when power to the central coil is not needed, limiting the operational range of the tool.

A known multi-coil ICP source is disclosed in U.S. Pat. No. 6,267,074. This ICP source uses three separated coils, three power generators, multiple gas injectors and provides a complete control over plasma. The ICP source has, however, three generators, three matchers and an extremely expensive dielectric window with very complex shape and multiple channels for gas injection. The capital cost and maintenance cost of such a system is not justified for most etch processes.

Another common problem with ICP sources is a severe sputtering of a dielectric plate separating an ICP coil from a process chamber due to RF power capacitive coupling from the coil to plasma and very high voltage (a few kV per turn) applied to the coil. The sputtering both affects plasma and increases the capital cost of the tool and its maintenance cost. Overall process controllability and, finally, process yield deteriorates.

Yet another common problem with ICP systems is an azimuthal nonuniformity caused by the capacitive coupling of the coil. Such azimuthal nonuniformity can be caused for different reasons. One reason, for example, is that for secondary electrons emitted from the surface, the sheath is collisionless. These electrons enter the plasma with energy strongly dependent on the position from where the electrons were emitted. Electrons that were emitted near the ends of a coil have significantly higher energy than those emitted near the center of a coil or away from the coil. Although these electrons quickly mix in the volume, they do create noticeable azimuthal plasma nonuniformity.

To eliminate both sputtering and azimuthal nonuniformity caused by a capacitive coupling of a coil, one can use a Faraday shield as disclosed in U.S. Pat. Nos. 7,232,767, 6,551,447, and U.S. Patent Application Publication No. 2007/0181257. A Faraday shield also makes matching the coil to the power generator easier, more stable and less prone to plasma conditions. However, since a well-designed Faraday shield absorbs the capacitive component of the RF, the RF power transfer to the plasma is reduced. Further, since it is the capacitive component of the RF that initiates the plasma, a well-designed Faraday shield usually requires additional means for discharge ignition.

Some Faraday shield designs can also improve the radial plasma profile for many etch processes without using an additional coil. In particular, for many processes the bulk etch rate is center-fast, even if one uses only a single coil near the edge of the wafer. For instance, one exemplary known Faraday shield design selectively blocks any power coupling in the center of the source to correct for an intrinsic center-fast etch profile. However, this method of controlling the etch profile is inflexible in that the Faraday shield has to be redesigned for specific process chemistries, depending on the inherent etch profile of that chemistry. By adding a second coil, the etch profile can be adjusted dynamically, without changing the hardware, providing greatly increased process flexibility.

The use of a second coil with a Faraday shield in the center of a plasma source poses its own difficulties. Because of high RF voltage and requirements for safe spacing between parts, providing a second coil that is truly independent of a primary coil is a difficult task. One also has to provide means for the synchronization of generators (if using different generators) to prevent the coils from working against each other, further adding to the cost of the system.

The root cause of many problems in ICP sources is that every coil in any ICP source has the same function and works together in a similar way as other coils, so that the only differences between the coils is their respective designated areas of the wafer. Thus, a need exists for a multi-coil ICP source that avoids the above-mentioned problems and disadvantages. An ICP source that includes at least one secondary coil that can have a different structure from the primary coil and is operable to perform a different function from the primary coil would be particularly useful.

SUMMARY

Aspects and advantages of the invention will be set forth in part in the following description, or may be obvious from the description, or may be learned through practice of the invention.

One exemplary aspect of the present disclosure is directed to a method of processing a substrate in a plasma processing apparatus. The plasma processing apparatus includes a processing chamber having an interior operable to receive a process gas, a substrate holder operable to hold a substrate, a first inductive element disposed over the process chamber interior, and a second inductive element disposed over the process chamber interior. The method includes placing a substrate on the substrate holder within the interior of a processing chamber of a processing apparatus and admitting a process gas into the interior of the processing chamber. The method further includes energizing the first inductive element with electromagnetic energy at a first RF frequency and energizing the second inductive element with electromagnetic energy at a second RF frequency to generate a plasma in the interior of the processing chamber. The first RF frequency for the first inductive element is selected to be sufficiently different from a second RF frequency for the second inductive element to reduce cross-talk between the first inductive element and the second inductive element in the inductive plasma. The method includes processing the substrate in the plasma.

Another exemplary aspect of the present disclosure is directed to a plasma processing apparatus. The plasma processing apparatus includes a processing chamber having an interior space operable to receive a process gas and a substrate holder in the interior of the processing chamber operable to hold a substrate. The apparatus further includes at least one dielectric window, and a first inductive element disposed external to the processing chamber and adjacent the dielectric window. An RF generator is configured to provide electromagnetic energy to the inductive element. The first inductive element has a coil and a magnetic flux concentrator of ferrite material. The magnetic flux concentrator has a truncated shape or an L-shape.

Yet another exemplary aspect of the present disclosure is directed to an apparatus for processing a substrate in a plasma. The apparatus includes a processing chamber having an interior space operable to receive a process gas, a substrate holder in the interior of the processing chamber operable to hold a substrate, and at least one dielectric window. The apparatus further includes a primary inductive element proximate a peripheral portion of the processing chamber and a secondary inductive element proximate a central portion of the processing chamber. A metal shield is disposed around the secondary inductive element such that the metal shield separates the primary inductive element from the secondary inductive element. A Faraday shield is located between the first inductive element and the dielectric window. The metal shield and the Faraday shield form a unitary body.

Variations and modifications can be made to these exemplary embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure, including the best mode, to one of ordinary skill in the art, is set forth more particularly in the remainder of the specification, including reference to the accompanying figures, in which.

DETAILED DESCRIPTION

Figure 1:
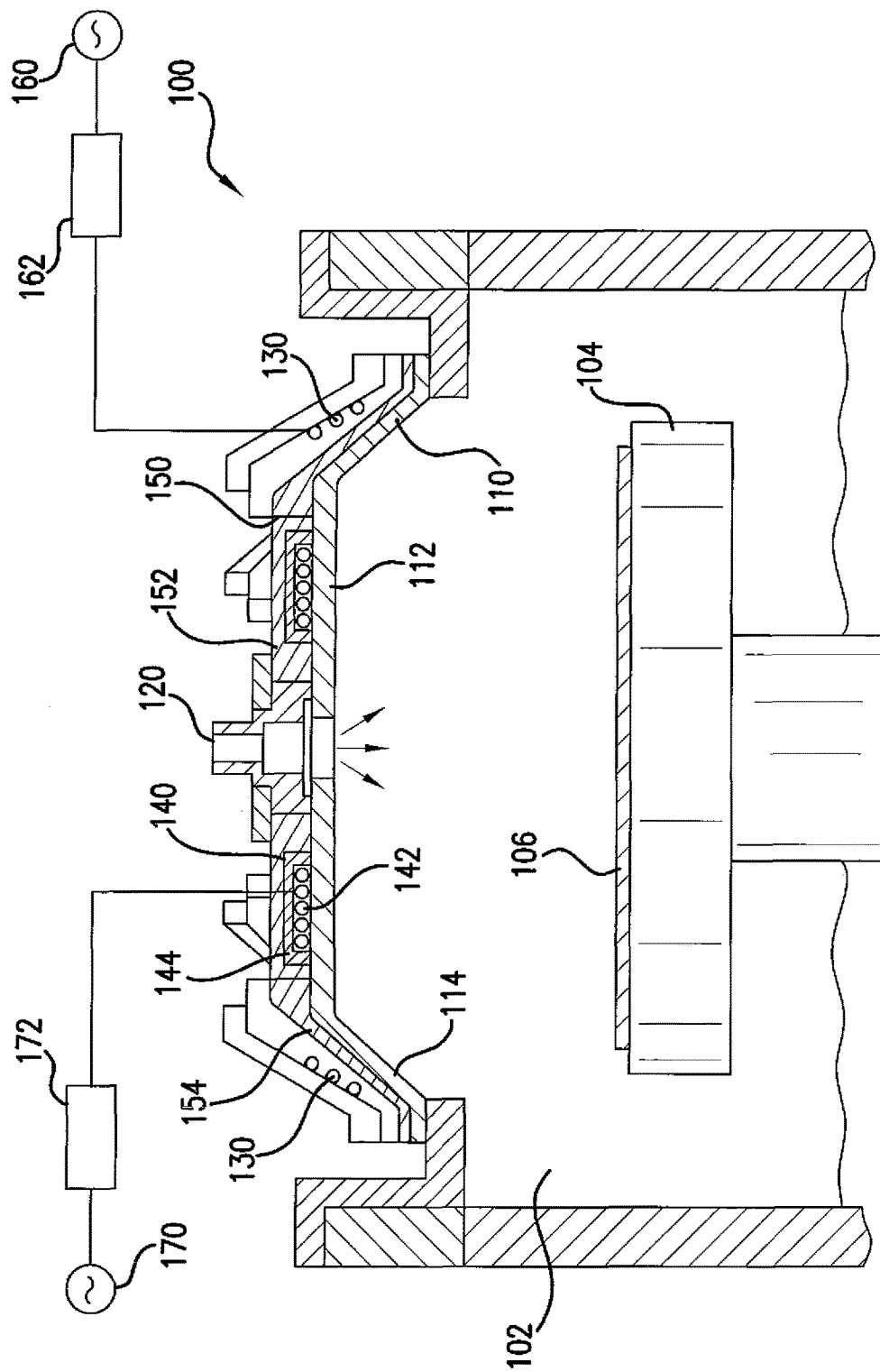
FIG. 1 depicts a plasma processing apparatus according to an exemplary embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present disclosure is directed to a plasma processing apparatus and method that includes two or more inductive elements, such as a primary coil and a secondary coil. The primary coil can be separated from the process chamber by a Faraday shield. The secondary coil can be separated from the primary coil by an electromagnetic shield to prevent cross-talk between the coils. In a particular implementation, different RF frequencies are selected for use on the first and second inductive elements. The frequencies are selected to reduce cross-talk between the first and second inductive elements in the plasma, providing for enhanced independent control of the inductive elements.

FIG. 1 depicts a plasma processing apparatus 100 according to an exemplary embodiment of the present disclosure. The plasma processing apparatus 100 includes a processing chamber defining an interior space 102. A pedestal or substrate holder 104 is used to support a substrate 106, such as a semiconductor wafer, within the interior space 102. A dielectric window 110 is located above the substrate holder 104. The dielectric window 110 includes a relatively flat central portion 112 and an angled peripheral portion 114. The dielectric window 110 includes a space in the central portion 112 for a showerhead 120 to feed process gas into the interior space 102.

The apparatus 100 further includes a plurality of inductive elements, such as primary inductive element 130 and secondary inductive element 140, for generating an inductive plasma in the interior space 102. The inductive elements 130, 140 can include a coil or antenna element that when supplied with RF power, induces a plasma in the process gas in the interior space 102 of plasma processing apparatus 100. For instance, a first RF generator 160 can be configured to provide electromagnetic energy through a matching network 162 to the primary inductive element 130. A second RF generator 170 can be configured to provide electromagnetic energy through a matching network 172 to the secondary inductive element 140.

While the present disclosure makes reference to a primary inductive and a secondary inductive, those of ordinary skill in the art, should appreciate that the terms primary and secondary are used for convenience purposes only. The secondary coil can be operated independent of the primary coil, and vice versa.

According to aspects of the present disclosure, the apparatus 100 can include a metal shield portion 152 disposed around the secondary inductive element 140. As discussed in more detail below, metal shield portion 152 separates the primary inductive element 130 and the secondary inductive element 140 to reduce cross-talk between the inductive elements 130, 140. Apparatus 100 can further include a Faraday shield 154 disposed between the primary inductive element 130 and the dielectric window 130. Faraday shield 154 can be a slotted metal shield that reduces capacitive coupling between the primary inductive element 154 and the process chamber 102. As illustrated, Faraday shield 154 can fit over the angled portion of the dielectric shield 110.

Figure 7:
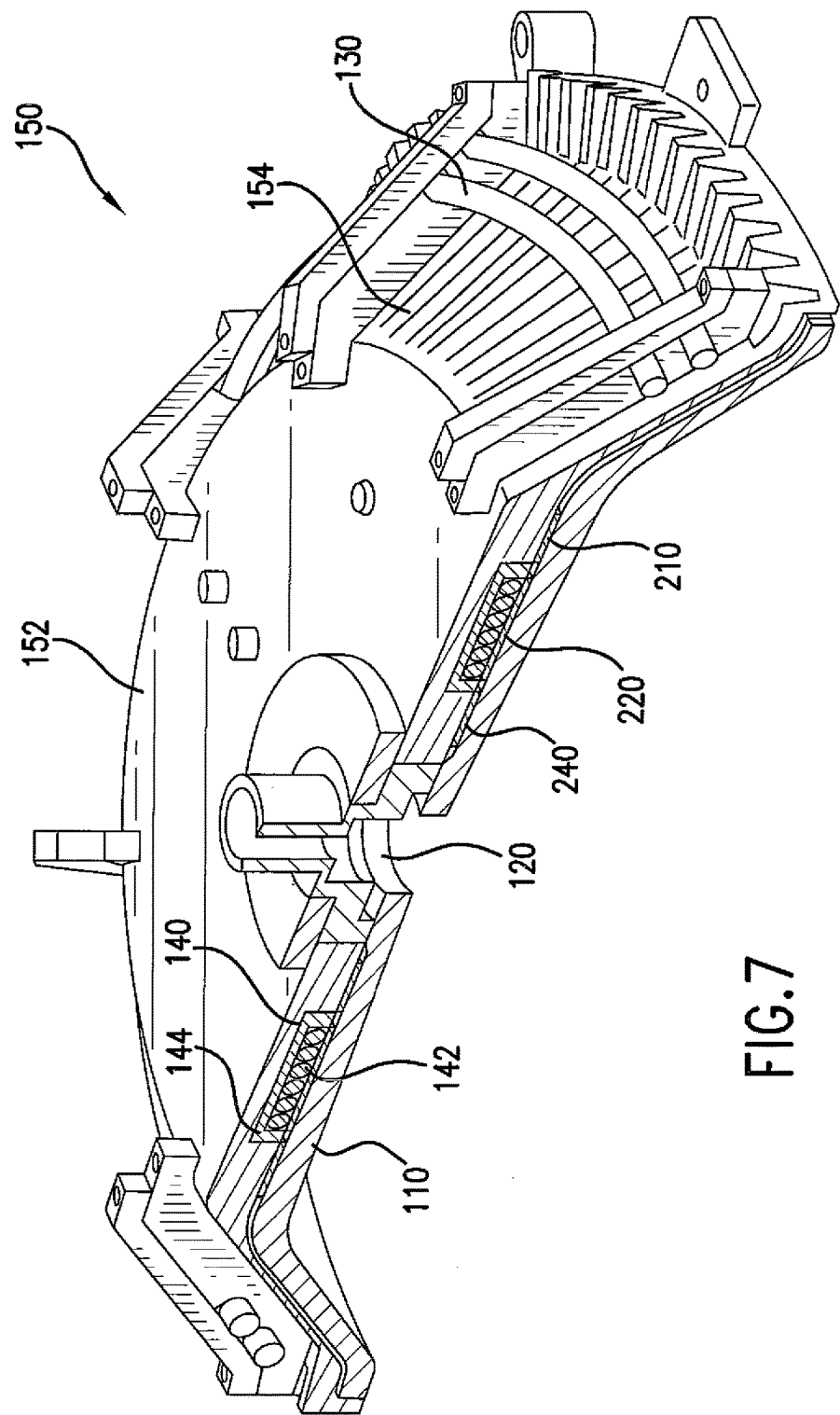
FIG. 7 depicts a perspective view of an exemplary unibody metal shield and Faraday shield according to an exemplary embodiment of the present disclosure.

In a particular embodiment, metal shield 152 and Faraday shield 154 can form a unitary body 150 for ease of manufacturing and other purposes. FIG. 7 illustrates a unitary body metal shield/Faraday shield 150 according to an exemplary embodiment of the present disclosure. The multi-turn coil of the primary inductive element 130 can be located adjacent the Faraday shield portion 154 of the unitary body metal shield/Faraday shield 150. The secondary inductive element 140 can be located proximate the metal shield portion 152 of metal shield/Faraday shield unitary body 150, such as between the metal shield portion 152 and the dielectric window 110.

The arrangement of the primary inductive element 130 and the secondary inductive element 140 on opposite sides of the metal shield 152 allows the primary inductive element 130 and secondary inductive element 140 to have distinct structural configurations and to perform different functions. For instance, the primary inductive element 130 can include a multi-turn coil located adjacent a peripheral portion of the process chamber. The primary inductive element 130 can be used for basic plasma generation and reliable start during the inherently transient ignition stage. The primary inductive element 130 can be coupled to a powerful RF generator and expensive auto-tuning matching network and can be operated at an increased RF frequency, such as at about 13.56 MHz.

The secondary inductive element 140 can be used for corrective and supportive functions and for improving the stability of the plasma during steady state operation. Since the secondary inductive element 140 can be used primarily for corrective and supportive functions and improving stability of the plasma during steady state operation, the secondary inductive element 140 does not have to be coupled to as powerful an RF generator as the first inductive element 130 and can be designed differently and cost effectively to overcome the difficulties associated with previous designs. As discussed in detail below, the secondary inductive element 140 can also be operated at a lower frequency, such as at about 2 MHz, allowing the secondary inductive element 140 to be very compact and to fit in a limited space on top of the dielectric window.

According to exemplary aspects of the present disclosure, the primary inductive element 130 and the secondary inductive element 140 are operated at different frequencies. The frequencies are sufficiently different to reduce cross-talk between the primary inductive element 130 and the secondary inductive element 140. For instance, the frequency applied to the primary inductive element 130 can be at least about 1.5 times greater than the frequency applied to the secondary inductive element 140. In a particular embodiment, the frequency applied to the primary inductive element 130 can be about 13.56 MHz and the frequency applied to the secondary inductive element 140 can be in the range of about 1.75 MHz to about 2.15 MHz. Other suitable frequencies can also be used, such as about 400 kHz, about 4 MHz, and about 27 MHz. While the present disclosure is discussed with reference to the primary inductive element 130 being operated at a higher frequency relative to the secondary inductive element 140, those of ordinary skill in the art, using the disclosures provided herein, should understand that the secondary inductive element 140 could be operated at the higher frequency without deviating from the scope of the present disclosure.

Due to the different frequencies that can be applied to the primary inductive element 130 and the secondary inductive element 140, there is reduced interference between the inductive elements 130, 140. More particularly, the only interaction in the plasma between the inductive elements 130, 140 is through plasma density. Accordingly, there is no need for phase synchronization between the RF generator 160 coupled to the primary inductive element 130 and the RF generator 170 coupled to the secondary inductive element 140. Power control is independent between the inductive elements. Additionally, since the inductive elements 130, 140 are operating at distinctly different frequencies, it is practical to use frequency tuning of the RF generators 160, 170 for matching the power delivery into the plasma, greatly simplifying the design and cost of any additional matching networks.

Compared to the primary inductive element 130 operated at 13.56 MHz, the secondary inductive element 140 can be operated at about 2 MHz and can have a larger number of turns and thus operate at lower current magnitude $$I_{coil} \propto P_{pl}/R_{pl}N,$$

where $I_{coil}$ is a coil current, $P_{pl}$—is a power deposited in plasma by the coil, $R_{pl}$—is plasma resistance and N—is a number of turns of the coil. Low current allows usage of a regular medium gauge wires in the coil, rather than large gauge wires or copper tubes.

Due to the lower operation frequency (f), the secondary inductive element 140 with inductance L does not need to operate at as high a voltage as a coil operated at a higher frequency of the same diameter D (assuming it deposits into plasma the same power $P_{pl}$ and produces plasma with the same parameters, $R_{pl}$):

$$V_{coil} \propto fLI_{coil} \propto fDN^2 I_{coil} \propto fDN\sqrt{P_{pl}/R_{pl}}$$

and with smaller diameter the voltage is much smaller than that used for driving the first coil. Because the secondary inductive element 140 can be operated at a reduced voltage and current, the secondary inductive element 140 can have a compact design that can be embedded into the metal shield 150.

For instance, as illustrated in FIGS. 2-5, the second inductive element 140 can include a planar coil 142 and a magnetic flux concentrator 144. The magnetic flux concentrator 144 is made from a ferrite material. Use of a magnetic flux concentrator with a proper coil gives high plasma coupling and good energy transfer efficiency of the secondary inductive element 140, and significantly reduces its coupling to the metal shield 150. Use of a lower frequency, such as about 2 MHz, on the secondary inductive element 140 increases the skin layer, which also improves plasma heating efficiency.

Figure 2:
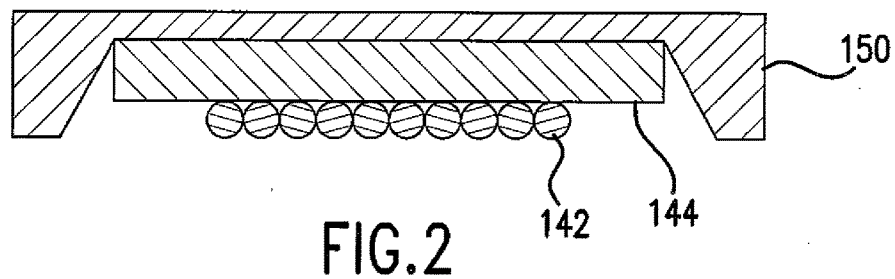
FIG. 2 depicts an exemplary inductive element according to an exemplary embodiment of the present disclosure.
Figure 3:
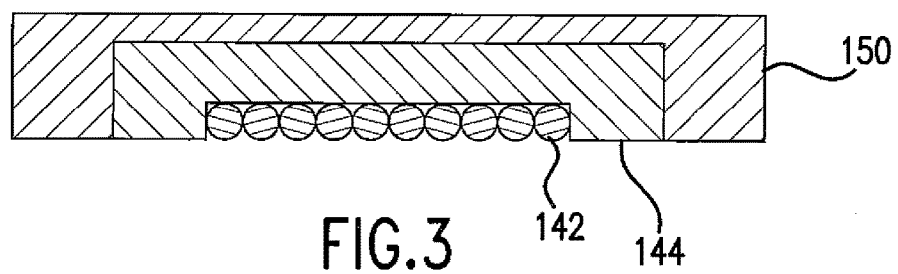
FIG. 3 depicts an exemplary inductive element according to an exemplary embodiment of the present disclosure.
Figure 4:
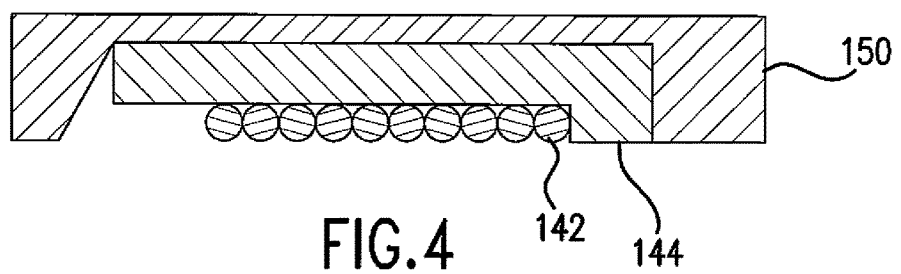
FIG. 4 depicts an exemplary inductive element according to an exemplary embodiment of the present disclosure.
Figure 5:
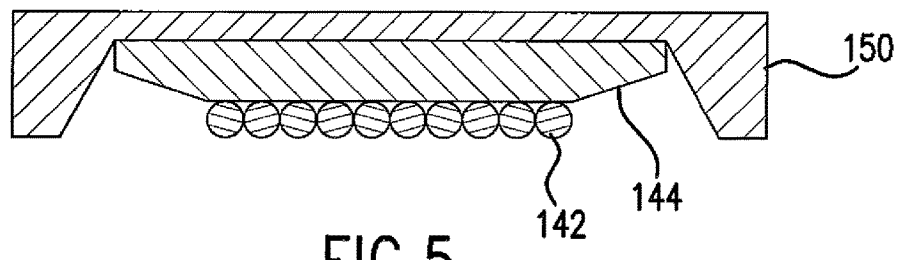
FIG. 5 depicts an exemplary inductive element according to an exemplary embodiment of the present disclosure.

According to particular aspects of the present disclosure, the magnetic flux concentrator 144 can have various shapes, depending on the primary requirements or constraints of the apparatus 100. For instance, if the goal is to have a soft profile control with a smooth power distribution in plasma (e.g. central area) and space allows the coil to be a bit wider, then the magnetic flux concentrator 144 can have a planar shape as illustrated in FIG. 2 or a truncated shape as illustrated in FIG. 4. If space is limited and high efficiency of the secondary inductive element 140 is important, or strong localization of power input into the plasma is important, (e.g. near edge), then it can be desirable to include a magnetic flux concentrator 144 having a U-shape with ends facing the dielectric window. In some cases, it may be desirable to provide asymmetric heating with respect to the coil position (more localized at one edge of the coil). In these cases, a magnetic flux concentrator 144 having an L-shape with one end facing the dielectric window may be desirable. The gas injection profile of the apparatus 100 may also affect the choice of shape for the magnetic flux concentrator.

According to aspects of the present disclosure, the different inductive elements 130 and 140 can carry different functions. Specifically, only the primary inductive element 130 has to carry out the most vital function of the plasma generation during ignition and providing enough priming for the secondary inductive element 140. This primary inductive element 130 can participate in the operation of the ICP tool and should have coupling to both plasma and the grounded shield to stabilize plasma potential. The Faraday shield 154 associated with the first inductive element 130 avoids window sputtering and can be used to supply the coupling to the ground.

Additional coils can be operated in the presence of good plasma priming provided by the primary inductive element 130 and as such, preferably have good plasma coupling and good energy transfer efficiency to plasma. A secondary inductive element 140 that includes a magnetic flux concentrator 144 provides both a good transfer of magnetic flux to plasma volume and at the same time a good decoupling of the secondary inductive element 140 from the surrounding metal shield 150. The use of magnetic flux concentrators 144 and symmetric driving of the secondary conductive element 140 further reduces the amplitude of the voltage between coil ends and surrounding grounded elements. This practically eliminates sputtering of the dome, but at the same time gives some small capacitive coupling to plasma, which can be used to assist ignition.

Figure 8:
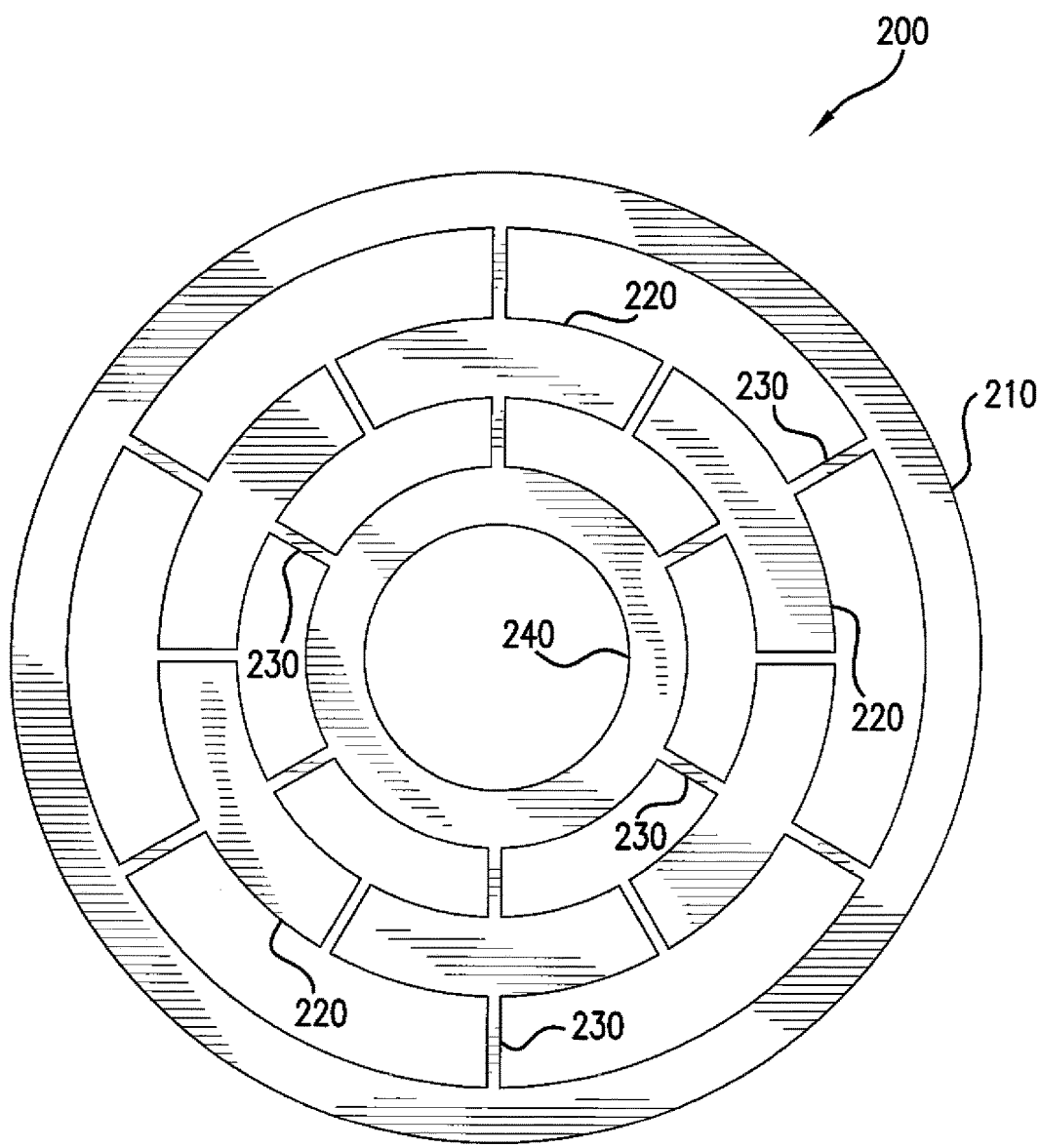
FIG. 8 depicts a plan view of an exemplary Faraday shield that can be used with an inductive element according to an exemplary embodiment of the present disclosure.

However, if capacitive coupling is undesirable, a very simple and thin Faraday shield can be used in combination with this secondary inductive element 140, such as the Faraday shield 200 illustrated in FIG. 8. Construction of the secondary inductive element 140 with a planar coil 142 and ferrite (or similar non-conductive, high magnetic permeability material) magnetic flux concentrators 144 allows for the very efficient and low cost design for Faraday shield 200. The Faraday shield 200 of FIG. 8 can be simply stamped out of a thin (0.25-0.5 mm) sheet metal. The Faraday shield 200 includes one or two solid metal portions, a first portion 210 of solid metal and/or a second portion 240 of solid metal. A plurality of leaf elements 220 cover the planar coil 142. Radial spike elements 230 connect the leaf elements 220 with portions 210 and 240 of the Faraday shield 200.

Since the leaf elements 220 are parallel to the planar coil 142 and do not cover the magnetic flux concentrator 142, the leaf-type elements 220 do not interfere with magnetic field and magnetic flux from the magnetic flux concentrator 144 freely enters the plasma. On the other hand, the spikes 230 connecting all the leaf-type elements 220 with surrounding portions 210 and 240, do cross the flux coming out of the magnetic flux concentrators 144 but they have very small total area to interfere with the magnetic field. The exemplary Faraday shield of FIG. 8 is easy to install and to include as part of a process chamber. If grounding of the shield is preferred, then one can place a thin RF ground spiral on the first portion 210 and/or second portion 240 of the shield to connect it to the main electromagnetic shield 150. One possible placement of the Faraday shield 200 is shown in FIG. 7, indicating position of elements 210, 220 and 240 in the assembly.

Figure 6:
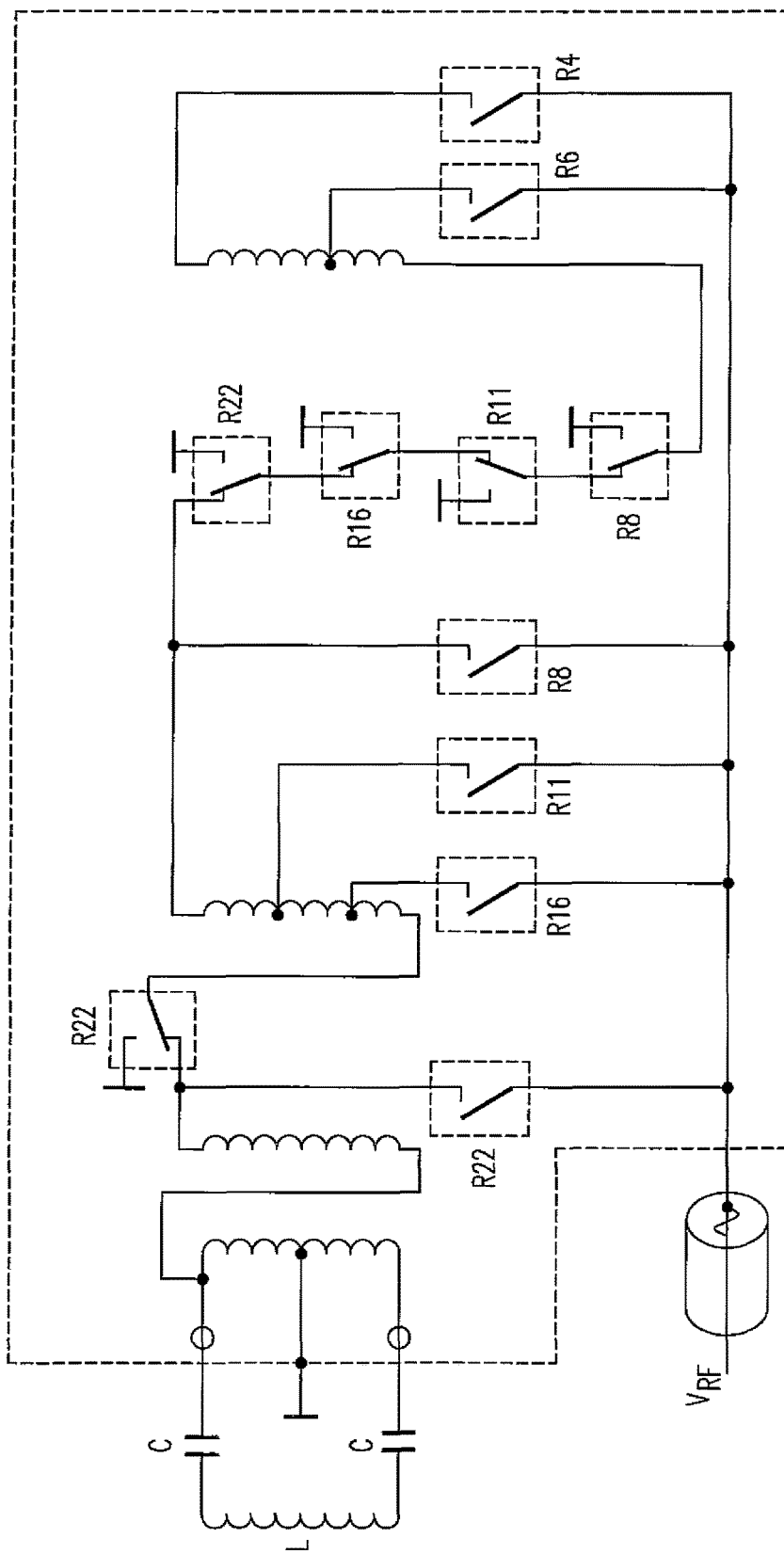
FIG. 6 depicts an exemplary matching circuit for an inductive element according to an exemplary embodiment of the present disclosure.

Because the secondary inductive element 140 can be operated when good priming is provided by the primary inductive element 140, the matching of the second inductive element 140 to the source can be simplified. For instance, the match circuit illustrated in FIG. 6 including a simple transformer matcher with just a few switchable fixed impedance settings covers a wide range of gases and operational conditions. In fact, each setting covers a wide range of process parameters (power, gas pressure, gas flow) for each combination of gases. The impedance setting does not have to be changed if the recipe requires changing power or increasing or decreasing the amount of some gas in the mixture. Matching can be accomplished entirely by tuning the RE generator frequency. Only large changes of gas composition (e.g. pure Ar to Oxygen or $SF_6$ containing mixture) require change of the impedance setting. The use of two generators essentially allows a low cost switching circuit without need to reignite plasma. Since the primary coil is always "ON", one can always provide a satisfactory algorithm for switching impedance setting in the secondary coil with low or zero power applied to that coil.

An ICP source according to exemplary embodiments of the present disclosure has shown very robust behavior of the source and very wide process window. The source can easily ignite and sustain plasma in most process gases (including "difficult" gases like pure HBr or $SF_6$) with significantly lower total power than otherwise was needed if one used only one coil. One could even sustain these discharges without any bias power. In fact, the use of the exemplary inductive element arrangement of the present disclosure actually showed better stability and efficiency than sources with only one kind of coil or with multiple coils of similar structure. Despite numerous attempts, instabilities associated with discharges in electronegative gases, often observed in other TCP reactors have not been detected.

Figure 9:
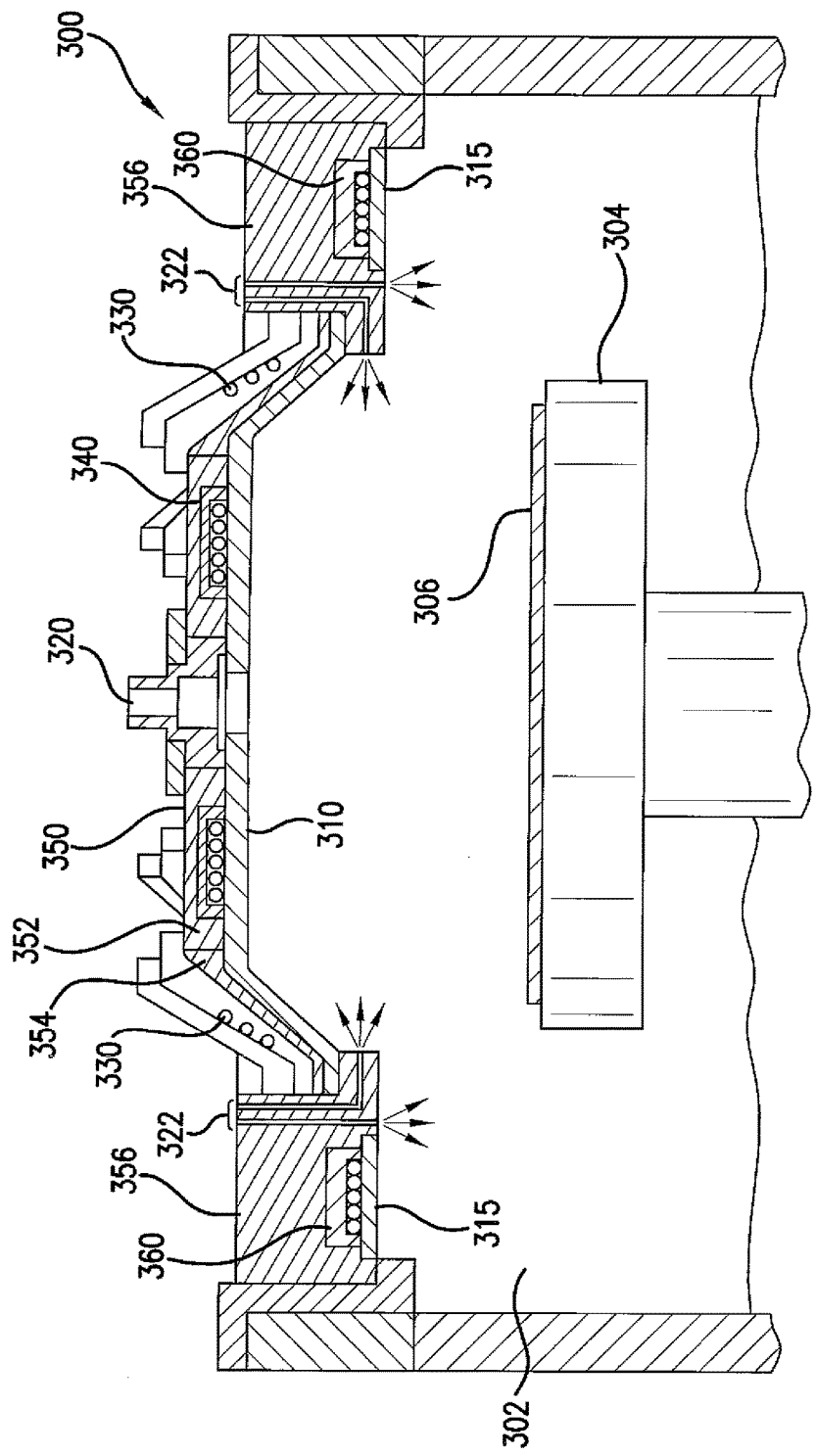
FIG. 9 depicts a plasma processing apparatus according to another exemplary embodiment of the present disclosure.

FIG. 9 illustrates an exemplary ICP source 300 according to another exemplary embodiment of the present disclosure. As illustrated in FIG. 9, the ICP source 300 includes many similar elements to the reactor 100 of FIG. 1, including a chamber defining an interior space 302, a pedestal 304 used to support a substrate 306, a dielectric window 310, and a primary inductive element 330 and a secondary inductive element 340. The dielectric window 310 includes a flat central portion and an angled peripheral portion.

The ICP source 300 includes a metal shield 352 separating the primary inductive element 330 and the secondary inductive element 340. The metal shield 352 can be disposed around the secondary inductive element 340. The ICP source 300 can further include a Faraday shield 354 disposed between the primary inductive element 330 and the angled peripheral portion of the dielectric window. In a particular implementation, metal shield 352 and Faraday shield 354 can form a single unitary body 350.

The ICP source 300 further includes a third inductive element 360 adjacent a dielectric window 315. Similar to the secondary inductive element 340, the third inductive element 360 can include a planar coil and a magnetic flux concentrator. The magnetic flux concentrator can have a planar shape, U-shape, L-shape, or truncated shape. The third inductive element 360 can be located at the periphery of the chamber such that the diameter of the coil of the third inductive element 360 is greater than the diameter of the coil of the primary inductive element 330. A plurality of feed gas ports 322 can be used to feed process gas into the chamber interior 302 proximate the location of the third inductive element 360. The third inductive element 360 can have a metal shield portion 356 separating the third inductive element 360 from the first inductive element 330. A Faraday shield 200 can be disposed between the third inductive element 360 and the dielectric window 315.

Figure 10:
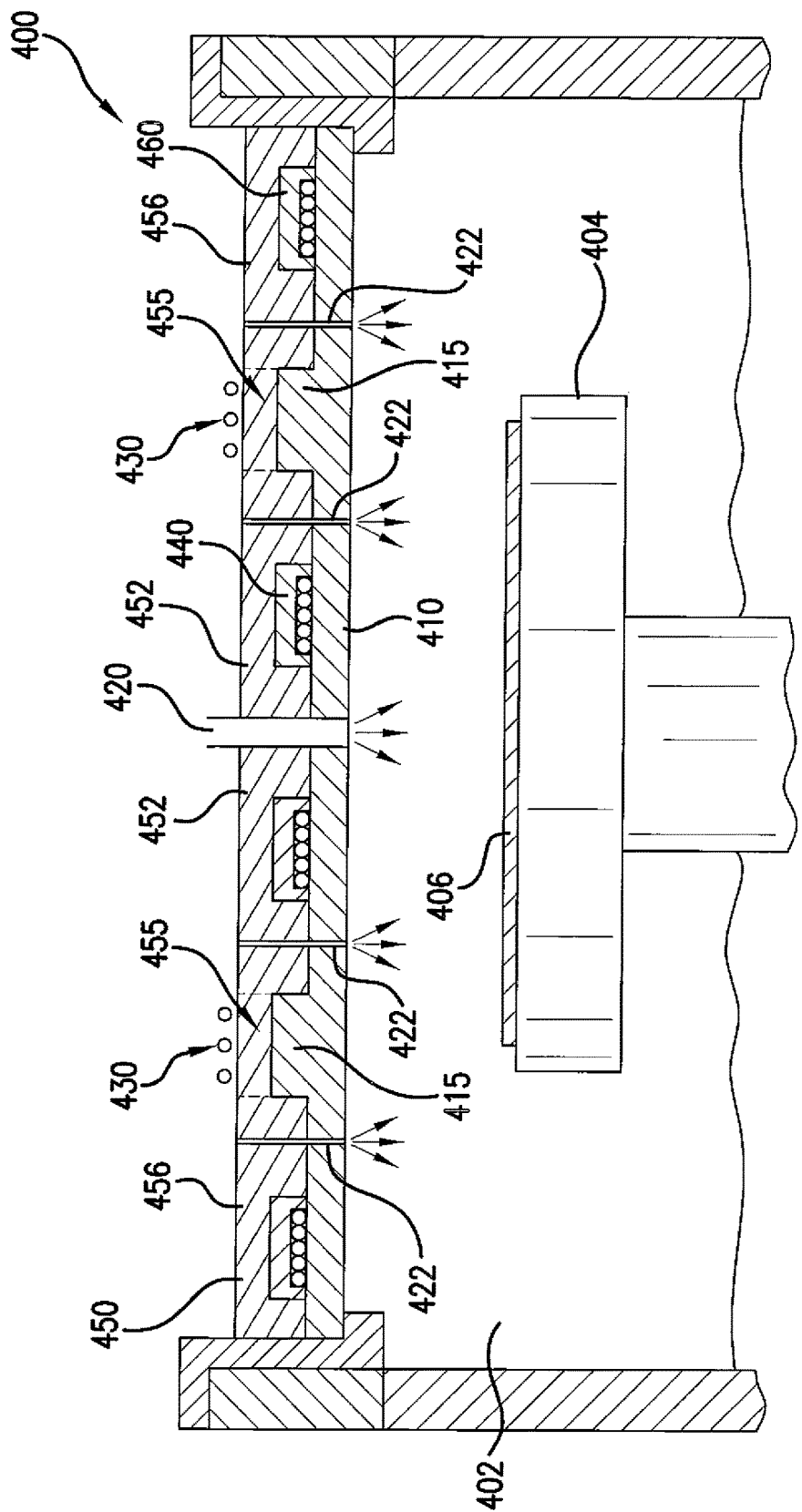
FIG. 10 depicts a plasma processing apparatus according to another exemplary embodiment of the present disclosure.

FIG. 10 illustrates an exemplary ICP source 400 according to another exemplary embodiment of the present disclosure. ICP source 400 is similar to ICP source 300 of FIG. 9 except that ICP source 400 includes a flat ceiling as opposed to the frusto-conical ceiling of ICP source 300. As shown in FIG. 10, the ICP source 400 includes a chamber defining an interior space 402, a pedestal 404 used to support a substrate 406, a dielectric window 410, and a primary inductive element 430 and a secondary inductive element 440.

The ICP source 400 further includes a third inductive element 460 adjacent dielectric window 410. Similar to the secondary inductive element 440, the third inductive element 460 can include a planar coil and a magnetic flux concentrator. The magnetic flux concentrator can have a planar shape, U-shape, L-shape, or truncated shape. The third inductive element 460 can be located at the periphery of the chamber such that the diameter of the coil of the third inductive element 460 is greater than the diameter of the coil of the first inductive element 430. A plurality of feed gas ports 422 can be used to feed process gas into the chamber interior 402 proximate the location of the inductive element 460, 440. The third inductive element 460 can have a metal shield portion 456 separating the third inductive element 460 from the primary inductive element 430. Optionally, a Faraday shield can be disposed between the third inductive element 460 and the dielectric window 415.

The dielectric window 410 is relatively flat across its entire width and can include thicker portions 415 proximate the primary inductive element 430. The apparatus can also include a slotted Faraday shield 455 disposed between the primary inductive element 430 and the thicker portions 415 of dielectric window 410. One or more metal shields can be used to separate the various inductive elements 430, 440, and 460 of ICP source 400. For instance, a metal shield 452 surrounding secondary inductive element 440 can be used to separate the secondary inductive element 440 from the primary inductive element 430 and the third inductive element 460. A metal shield 456 can be used to separate the third inductive element 460 from the secondary inductive element 440 and the primary inductive element 430. In a particular embodiment, metal shields 452 and 456 can form a unitary body 450.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method of processing a substrate in a plasma processing apparatus, the plasma processing apparatus comprising a processing chamber having an interior operable to receive a process gas, a substrate holder operable to hold a substrate, a first inductive element disposed over the process chamber interior, and a second inductive element disposed over the process chamber interior, the first and second inductive element each configured to inductively generate a plasma in the process chamber interior, the method comprising:

placing a substrate on the substrate holder within the interior of the processing chamber of the processing apparatus;

admitting a process gas into the interior of the processing chamber;

energizing the first inductive element with electromagnetic energy at a first RF frequency to generate inductively a plasma in the interior of the process chamber;

energizing the second inductive element with electromagnetic energy at a second RF frequency to generate inductively a plasma in the interior of the processing chamber;

selecting the first RF frequency to be sufficiently different from the second RF frequency to reduce interference between the first inductive element and the second inductive element through the inductively coupled plasma; and processing the substrate in the plasma.

2. The method of claim 1, wherein the first RF frequency is selected to be at least about 1.5 times greater than the second RF frequency.

3. The method of claim 1, wherein the first RF frequency is selected to be about 13.56 MHz.

4. The method of claim 3, wherein the second RF frequency is selected to be in the range of about 1.75 MHz to about 2.15 MHz.

5. The method of claim 1, wherein a metal shield separates the first inductive element and the second inductive element in the plasma processing apparatus.

\* \* \* \* \*